(12) United States Patent
Han et al.

(10) Patent No.: US 11,842,764 B2
(45) Date of Patent: Dec. 12, 2023

(54) ARTIFICIAL INTELLIGENCE PROCESSOR AND METHOD OF PROCESSING DEEP-LEARNING OPERATION USING THE SAME

(71) Applicant: ELECTRONICS AND TELECOMMUNICATIONS RESEARCH INSTITUTE, Daejeon (KR)

(72) Inventors: Jin-Ho Han, Seoul (KR); Byung-Jo Kim, Sejong-si (KR); Ju-Yeob Kim, Daejeon (KR); Hye-Ji Kim, Daejeon (KR); Joo-Hyun Lee, Daejeon (KR); Seong-Min Kim, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 9 days.

(21) Appl. No.: 17/544,202

(22) Filed: Dec. 7, 2021

(65) Prior Publication Data

US 2022/0180919 A1 Jun. 9, 2022

(30) Foreign Application Priority Data

Dec. 8, 2020 (KR) .................. 10-2020-0170812
Nov. 19, 2021 (KR) .................. 10-2021-0160032

(51) Int. Cl.
*G11C 11/4096* (2006.01)
*G11C 11/4093* (2006.01)
(Continued)

(52) U.S. Cl.
CPC ........ *G11C 11/4096* (2013.01); *G06F 7/5443* (2013.01); *G06N 3/063* (2013.01); *G11C 11/4093* (2013.01); *G11C 11/54* (2013.01)

(58) Field of Classification Search
CPC .... G11C 11/4096; G11C 11/54; G06F 7/5443
(Continued)

(56) References Cited

U.S. PATENT DOCUMENTS 10,635,968 B2    4/2020  Paul et al.
11,570,638 B2 *  1/2023  Perez-Ramirez ..... H04W 24/06
(Continued)

FOREIGN PATENT DOCUMENTS

KR    10-2016-0141675    12/2016
KR    10-2019-0063437    6/2019

OTHER PUBLICATIONS

Angizi Shaahin et al., "MRIMA: An MRAM-Based In-Memory Accelerator", IEEE Transactions On Computer-Aided Design of Integrated Circuits and Systems, May 2020, pp. 1123-1136, vol. 39, No. 5.

*Primary Examiner* — Anthan Tran
(74) *Attorney, Agent, or Firm* — KILE PARK REED & HOUTTEMAN PLLC

(57) ABSTRACT

Disclosed herein is an Artificial Intelligence (AI) processor. The AI processor includes multiple NVM AI cores for respectively performing basic unit operations required for a deep-learning operation based on data stored in NVM; SRAM for storing at least some of the results of the basic unit operations; and an AI core for performing an accumulation operation on the results of the basic unit operation.

16 Claims, 6 Drawing Sheets

(51) Int. Cl.
  *G11C 11/54* (2006.01)
  *G06F 7/544* (2006.01)
  *G06N 3/063* (2023.01)

(58) Field of Classification Search
  USPC .................................................. 365/189.11
  See application file for complete search history.

(56) References Cited

U.S. PATENT DOCUMENTS

| | | |
|---|---|---|
| 2018/0189643 A1 | 7/2018 | Kim et al. |
| 2019/0065150 A1 | 2/2019 | Heddes et al. |
| 2019/0164036 A1 | 5/2019 | Kim et al. |
| 2019/0244084 A1 | 8/2019 | Cho et al. |
| 2020/0184335 A1* | 6/2020 | Rom ........................ G06N 3/04 |
| 2021/0342186 A1 | 11/2021 | Ki |
| 2022/0044719 A1* | 2/2022 | Li ......................... G11C 11/223 |

* cited by examiner

ARTIFICIAL INTELLIGENCE PROCESSOR AND METHOD OF PROCESSING DEEP-LEARNING OPERATION USING THE SAME

CROSS REFERENCE TO RELATED APPLICATIONS

This application claims the benefit of Korean Patent Application No. 10-2020-0170812, filed Dec. 8, 2020, and No. 10-2021-0160032, filed Nov. 19, 2021, which are hereby incorporated by reference in their entireties into this application.

BACKGROUND OF THE INVENTION

1. Technical Field

The present invention relates generally to an Artificial Intelligence (AI) processor, and more particularly to an AI processor structure based on AI cores having different degrees of operation efficiency for low-power design.

2. Description of the Related Art

Semiconductors may be largely classified into two types, namely memory semiconductors and system semiconductors. Recently, due to limitations in dealing with various applications, such as big data, the Internet of Things (IoT), and the like, using these two types of semiconductors, research and development for combining these two types of semiconductors has been underway. A semiconductor in which these two functions are combined is a Processing-In-Memory (PIM) semiconductor. PIM is configured by adding a processor function for operational tasks in a memory semiconductor for storage tasks.

Meanwhile, reducing power consumption is a very important issue in order to apply a deep-learning accelerator to applications such as Artificial Intelligence of Things (AIoT) applications or the like. To this end, attempts to reduce power consumption by minimizing the number of accesses to external memory and to maximize operation performance have been made. From the aspect of the deep-learning accelerator, PIM technology is technology for reusing data read from the external memory to the greatest extent possible before again exporting the data to the external memory.

Accordingly, what is urgently required is an AI processor capable of operating at low power based on Processing-In-Memory (PIM) technology by suitably combining a memory semiconductor with an AI processor.

SUMMARY OF THE INVENTION

An object of the present invention is to provide a low-power AI processor using a deep-learning accelerator core (AI core) based on Processing-In-Memory (PIM) using Non-Volatile Memory (NVM), such as Magnetic Random-Access Memory (MRAM), or the like.

Another object of the present invention is to enable an AI processor to operate at low power by appropriately combining multiple NVM AI cores and an AI core.

A further object of the present invention is to minimize the amount of power consumed by an AI processor by operating only components (AI cores) essential for a deep-learning operation.

Yet another object of the present invention is to minimize the amount of power consumed by an AI processor by storing or reading only a feature multiplied by a nonzero weight.

In order to accomplish the above objects, an AI processor according to the present invention includes multiple Non-Volatile Memory (NVM) AI cores for respectively performing basic unit operations required for a deep-learning operation based on data stored in NVM; SRAM for storing at least some of the results of the basic unit operations; and an AI core for performing an accumulation operation on the results of the basic unit operations.

Here, the AI core may generate an expanded bit operation result by accumulating the results of the basic unit operations.

Here, the basic unit operation may be a 4-bit Multiply and Accumulation (MAC) operation, and the expanded bit operation result may be 8 bits.

Here, some of the NVM AI cores and the AI core may be power-gated depending on the bit width required for the deep-learning operation.

Here, the bit width required for the deep-learning operation may be set for each layer corresponding to the deep-learning operation.

Here, the AI processor may further include an AI DRAM controller for providing weights required for the basic unit operations to the NVM based on AI data stored in DRAM.

Here, the AI DRAM controller may read features required for the basic unit operations from the DRAM and store the features in the SRAM.

Here, the AI DRAM controller may store only nonzero weights in the NVM.

Here, the AI DRAM controller may read only features to be multiplied by nonzero weights from the DRAM.

Here, the AI DRAM controller may include a Direct Memory Access (DMA) unit for performing control for reading data from the DRAM and writing data to the DRAM; a sparse weight unit for providing nonzero weight information to the DMA unit; and a DRAM protocol converter for writing data to the DRAM or reading data from the DRAM based on control of the DMA unit.

Here, each of the NVM AI cores may include an NVM array and a MAC operator for performing a MAC operation based on data read from the NVM array.

Also, a method for processing a deep-learning operation according to an embodiment of the present invention includes performing, by respective multiple Non-Volatile Memory (NVM) AI cores, basic unit operations required for a deep-learning operation based on data stored in NVM; storing at least some of the results of the basic unit operations in SRAM; performing, by an AI core, an accumulation operation on the results of the basic unit operations; and storing the result of the accumulation operation in the SRAM.

Here, the AI core may generate an expanded bit operation result by accumulating the results of the basic unit operations.

Here, the basic unit operation may be a 4-bit Multiply and Accumulation (MAC) operation, and the expanded bit operation result may be 8 bits.

Here, some of the NVM AI cores and the AI core may be power-gated depending on the bit width required for the deep-learning operation.

Here, the bit width required for the deep-learning operation may be set for each layer corresponding to the deep-learning operation.

Here, the SRAM may store features required for the basic unit operations.

Here, the NVM may store only nonzero weights.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
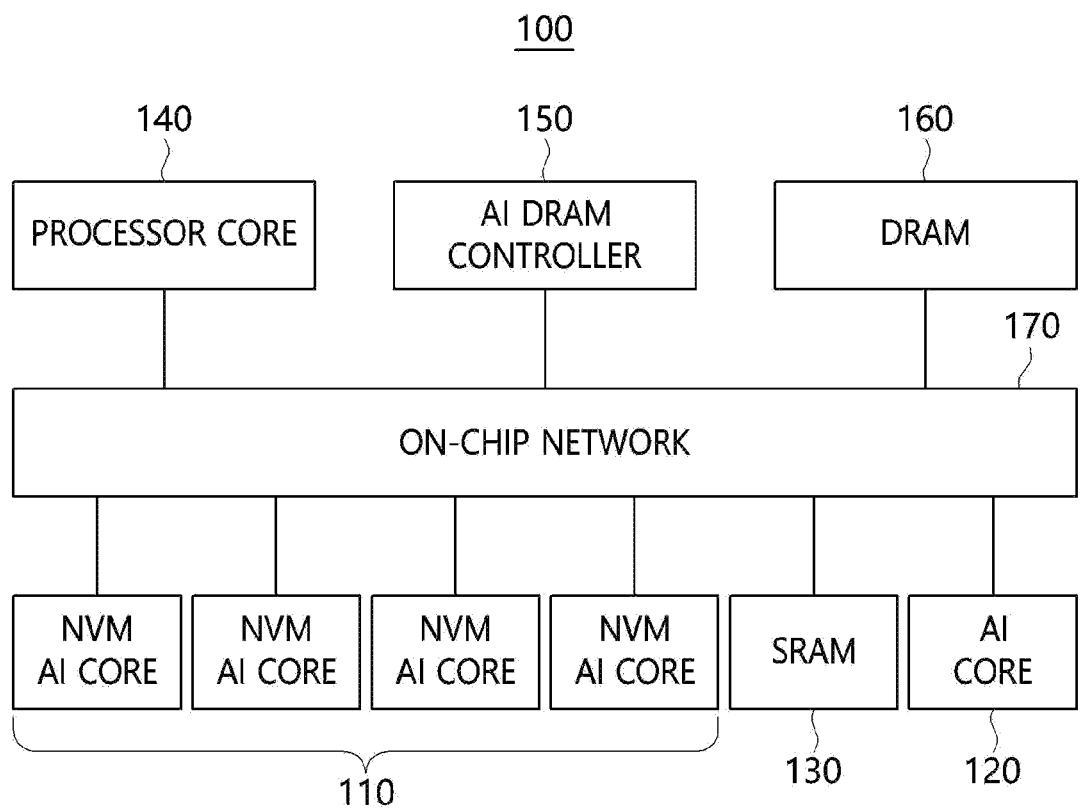
FIG. 1 is a block diagram illustrating an AI processor according to an embodiment of the present invention.

The advantages and features of the present invention and methods of achieving the same will be apparent from the exemplary embodiments to be described below in more detail with reference to the accompanying drawings. However, it should be noted that the present invention is not limited to the following exemplary embodiments, and may be implemented in various forms. Accordingly, the exemplary embodiments are provided only to disclose the present invention and to let those skilled in the art know the category of the present invention, and the present invention is to be defined based only on the claims. The same reference numerals or the same reference designators denote the same elements throughout the specification.

It will be understood that, although the terms "first," "second," etc. may be used herein to describe various elements, these elements are not intended to be limited by these terms. These terms are only used to distinguish one element from another element. For example, a first element discussed below could be referred to as a second element without departing from the technical spirit of the present invention.

The terms used herein are for the purpose of describing particular embodiments only, and are not intended to limit the present invention. As used herein, the singular forms are intended to include the plural forms as well, unless the context clearly indicates otherwise. It will be further understood that the terms "comprises," "comprising,", "includes" and/or "including," when used herein, specify the presence of stated features, integers, steps, operations, elements, and/or components, but do not preclude the presence or addition of one or more other features, integers, steps, operations, elements, components, and/or groups thereof.

Unless differently defined, all terms used herein, including technical or scientific terms, have the same meanings as terms generally understood by those skilled in the art to which the present invention pertains. Terms identical to those defined in generally used dictionaries should be interpreted as having meanings identical to contextual meanings of the related art, and are not to be interpreted as having ideal or excessively formal meanings unless they are definitively defined in the present specification.

Hereinafter, embodiments of the present invention will be described in detail with reference to the accompanying drawings. In the following description of the present invention, the same reference numerals are used to designate the same or similar elements throughout the drawings, and repeated descriptions of the same components will be omitted.

FIG. 1 is a block diagram illustrating an AI processor according to an embodiment of the present invention.

Referring to FIG. 1, the AI processor 100 according to an embodiment of the present invention includes a processor core 140, an AI DRAM controller 150, NVM AI cores 110, an AI core 120, Static Random-Access Memory (SRAM) 130, and an on-chip network 170. Here, the NVM AI cores 110 may be MRAM AI cores. Hereinafter, although MRAM, among various types of Non-Volatile Memory (NVM), is taken as an example for convenience of description, the technical idea of the present invention may be applied not only to Magnetic Random-Access Memory or Magneto-resistive Random-Access Memory (MRAM), among various types of NVM, but also to Ferroelectric RAM (F-RAM), FeFET memory, Resistive Random-Access Memory (Re-RAM), Phase-change Random-Access Memory (PRAM), and the like.

In the embodiment illustrated in FIG. 1, Dynamic Random-Access Memory (DRAM) 160 is described as being included in the AI processor 100 for convenience of description, but the DRAM 160 may be disposed outside the AI processor 100.

The AI processor 100 illustrated in FIG. 1 may operate based on heterogeneous AI cores (the NVM AI cores and the AI core) in order to operate at low power.

The respective Non-Volatile Memory (NVM) Artificial Intelligence (AI) cores 110, such as Magnetic Random-Access Memory (MRAM) AI cores and the like, perform basic unit operations required for a deep-learning operation based on data stored in NVM, such as MRAM or the like. For example, the deep-learning operation may be an operation using weights and features. For example, the basic unit operation may be a Multiply and Accumulation (MAC) operation performed using a 4-bit weight and a 4-bit feature.

Here, the SRAM 130 may store at least some of the results of the basic unit operations.

The AI core 120 performs an accumulation operation on the results of the basic unit operations.

Here, the input for the operation to be performed by the AI core 120 may be provided from the SRAM 130, and the result of the operation performed by the AI core 120 may be provided to the DRAM 160 via the SRAM 130.

Here, the AI core 120 accumulates the results of the basic unit operations, thereby generating an expanded bit operation result. For example, the basic unit operation may be a 4-bit Multiply and Accumulation (MAC) operation, and the expanded bit operation result may be 8 bits.

The processor core 140 performs the function of controlling the operation of the AI processor 100. Here, the processor core 140 may provide control commands to other components of the AI processor and receive the results thereof.

The AI DRAM controller 150 provides weights required for the basic unit operation to the NVM, such as MRAM or the like, based on AI data stored in the DRAM 160. Here, the AI DRAM controller 150 may operate so as to match the characteristics of an AI algorithm. Here, the AI DRAM controller 150 may store only nonzero weights in the NVM, such as MRAM or the like.

Here, the AI DRAM controller 150 may read features stored in the DRAM 160 to the SRAM 130. That is, the AI DRAM controller 150 may read features required for the basic unit operation from the DRAM 160 and store the same in the SRAM 130. Here, the AI DRAM controller 160 may read only the features to be multiplied by nonzero weights from the DRAM 160.

The SRAM 130 may store data input to or output from the NVM AI cores 110 and the AI core 120.

Here, some of the NVM AI cores 110 and the AI core 120 may be power-gated depending on the bit width required for the deep-learning operation. Here, the bit width required for the deep-learning operation may be set for each layer corresponding to the deep-learning operation.

In the example illustrated in FIG. 1, the NVM AI cores 110 process NVM-based AI operations (basic unit operations), and data for these operations, such as weights and the like, may be stored in the NVM. Here, the NVM may be MRAM, as described above.

The on-chip network 170 is an on-chip communication structure for enabling the processor core 140, the AI DRAM controller 150, the NVM AI cores 110, the AI core 120, and the SRAM 130 in the AI processor 100 to communicate with each other.

Each of the NVM AI cores 110 for power efficiency is designed to have a small size and to be capable of processing the minimum operation unit (a basic unit operation), and multiple NVM AI cores 110 are present in the AI processor 100.

Figure 2:
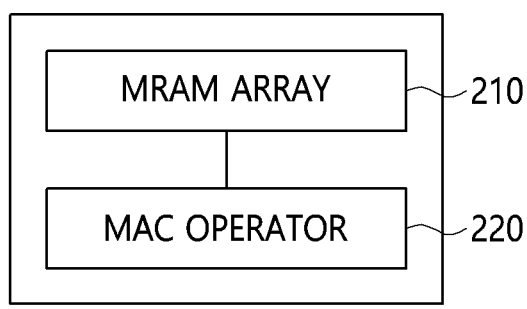
FIG. 2 is a block diagram illustrating an example of the NVM AI core illustrated in FIG. 1.

FIG. 2 is a block diagram illustrating an example of the NVM AI core illustrated in FIG. 1.

Referring to FIG. 2, the NVM AI core may be an MRAM AI core including an MRAM array 210 and a Multiply and Accumulation (MAC) operator 220.

The MRAM array 210 in which MRAM is integrated stores data required for a basic unit operation. For example, the MRAM array 210 may store weights to be used for a deep-learning operation. Because the weights used for a deep-learning operation do not change after a deep-learning model is set, the deep-learning operation may be continuously performed while changing only feature data after the weights are stored in the MRAM.

The MAC operator 220 performs a MAC operation based on the data read from the MRAM array 210. Here, other data (feature data) required for the MAC operation may be read from the SRAM 130 illustrated in FIG. 1.

For example, a 2-bit or 4-bit weight may be stored in the MRAM array 210. Here, the MAC operator 220 may perform a 2-bit or 4-bit Multiply and Accumulation (MAC) operation. Here, one piece of 2-bit or 4-bit input data of the MAC operator 220 may be provided from the MRAM array 210, and the other piece of 2-bit or 4-bit input data thereof may be provided from the SRAM 130 via the on-chip network 170. Here, the result of the operation performed by the MAC operator 220 may be stored again in the SRAM 130.

Figure 3:
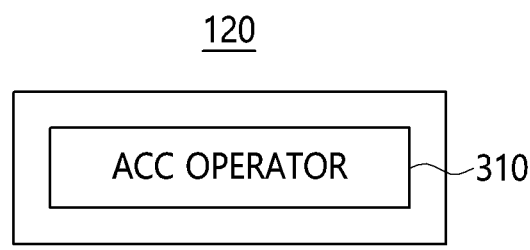
FIG. 3 is a block diagram illustrating an example of the AI core illustrated in FIG. 1.

FIG. 3 is a block diagram illustrating an example of the AI core illustrated in FIG. 1.

Referring to FIG. 3, the AI core 120 illustrated in FIG. 1 includes an ACC operator 310.

The ACC operator 310 receives the results of the basic unit operations performed by the NVM AI cores from the SRAM 130 as the input thereof and outputs the result of an accumulation operation performed thereon to the SRAM 130. For example, the result of the basic unit operation may be 4-bit data, and the AI core 120 may generate an expanded bit operation result 8 bits long using an accumulation operation performed on the 4-bit data and output the same to the SRAM. Here, the 4-bit data, which is the result of the basic unit operation, may be the result of a MAC operation performed on 4-bit weight data and 4-bit feature data, and the 8-bit data, which is the expanded bit operation result, may be the result of a MAC operation performed on 8-bit weight data and 8-bit feature data.

Figure 4:
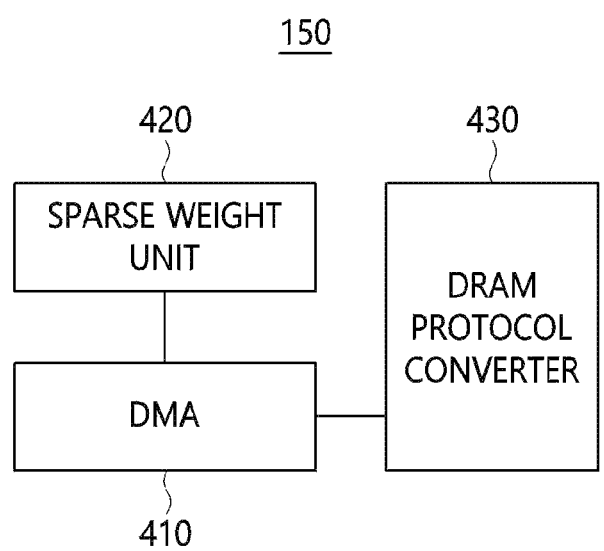
FIG. 4 is a block diagram illustrating an example of the AI DRAM controller illustrated in FIG. 1.

FIG. 4 is a block diagram illustrating an example of the AI DRAM controller illustrated in FIG. 1.

Referring to FIG. 4, the AI DRAM controller 150 includes a Direct Memory Access (DMA) unit 410, a sparse weight unit 420, and a DRAM protocol converter 430.

The DMA unit 410 performs control for reading data from the DRAM 160 and writing data to the DRAM 160.

The sparse weight unit 420 provides nonzero weight information to the DMA unit 410.

The DRAM protocol converter 430 writes data to the DRAM 160 or reads data therefrom under the control of the DMA unit 410.

That is, the AI DRAM controller 150 reads weight data and feature data required for processing an AI algorithm from the DRAM 160, which is external memory, stores the same in the NVM of the NVM AI cores 110, such as MRAM, or in the SRAM 130, and stores an output feature, which is an operation result stored in the SRAM, in the DRAM 160. Also, the AI DRAM controller may read feature data required for a subsequent operation from the DRAM 160 and store the same in the SRAM 130.

Here, the weight may be based on run-length-coded data. Here, run-length coding may be configured such that only nonzero weights are stored and such that, when weights are 0 or close to 0, only the number of weights (run-length) is stored. Here, the nonzero weights may be stored in the NVM, such as MRAM or the like, by the AI DRAM controller 150. Here, the sparse weight unit 420 may provide nonzero weight information or zero weight information to the DMA unit 410, and the DMA unit 410 may read only the features to be multiplied by the nonzero weight.

Figure 5:
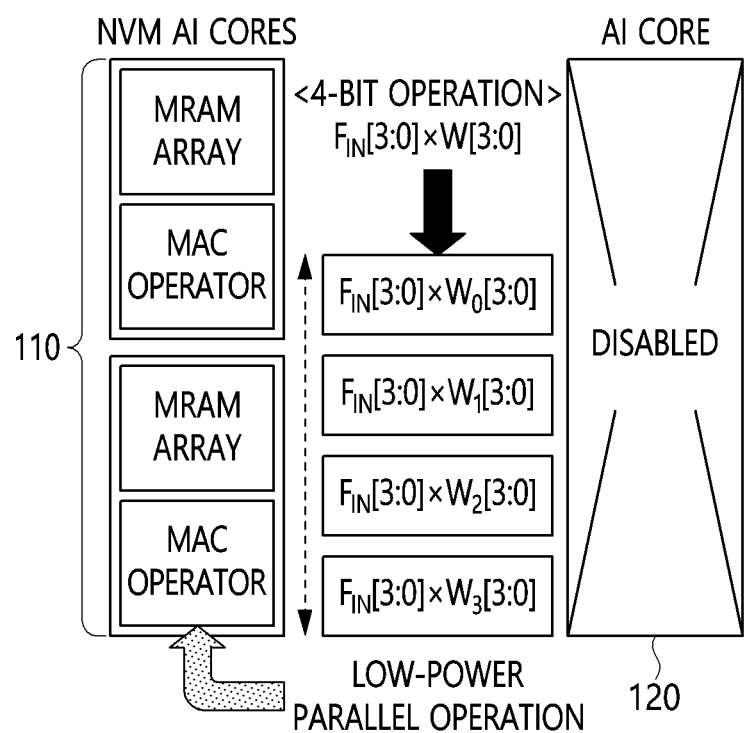
FIG. 5 is a block diagram illustrating an example of the operations of NVM AI cores and an AI core.

FIG. 5 is a block diagram illustrating an example of the operations of NVM AI cores and an AI core.

In the example illustrated in FIG. 5, the NVM AI cores 110 perform basic unit operations and store the results thereof in the SRAM, but the AI core 120 is disabled.

That is, each of the NVM AI cores 110 performs a 4-bit MAC operation and stores resultant 4-bit data in the SRAM in the example illustrated in FIG. 5. Here, the NVM AI cores 110 may be MRAM AI cores. Here, the AI core 120 may be power-gated. That is, when only a 4-bit width is required, the AI core 120 may be disabled by being power-gated to save power.

In the example illustrated in FIG. 5, $F_{IN}[3:0]$ denotes 4-bit feature data, and this feature data may be read from the SRAM. Here, each of $W_0[3:0]$, $W_1[3:0]$, $W_2[3:0]$, and $W_3[3:0]$ may be 4-bit weight data read from the NVM, such as MRAM or the like.

Figure 6:
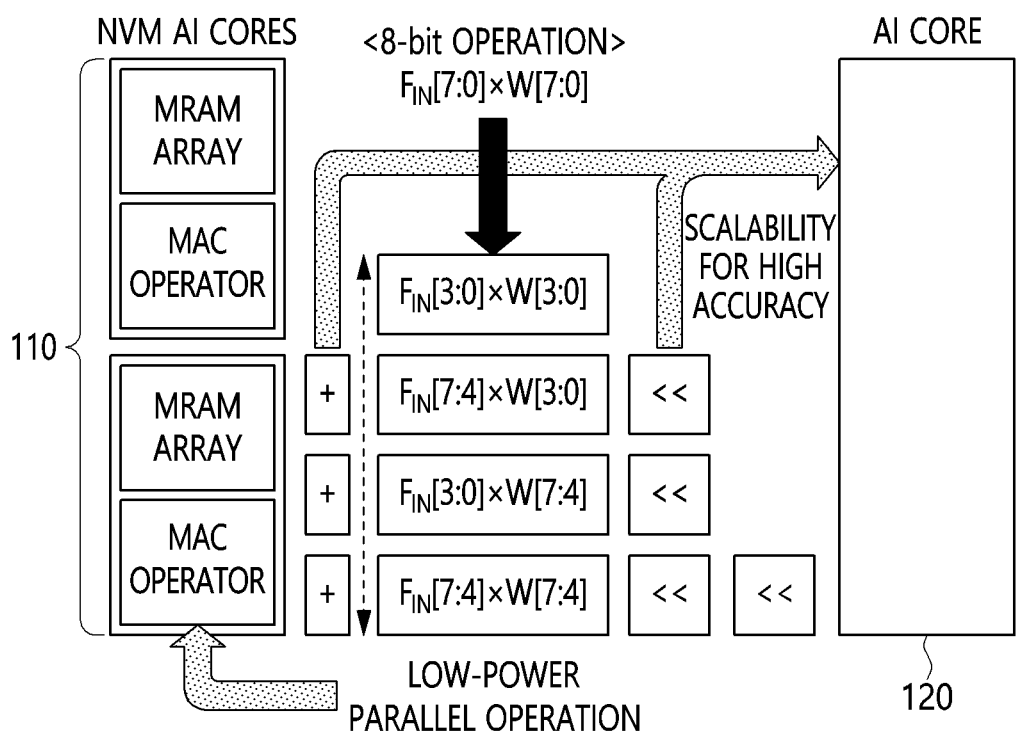
FIG. 6 is a block diagram illustrating another example of the operations of NVM AI cores and an AI core.

FIG. 6 is a block diagram illustrating another example of the operations of NVM AI cores and an AI core.

In the example illustrated in FIG. 6, the NVM AI cores 110 perform basic unit operations and store the results thereof in the SRAM, and the AI core 120 reads the results of the basic unit operations from the SRAM and performs an accumulation operation thereon, thereby generating an expanded bit operation result. Here, the NVM AI cores 110 may be MRAM AI cores.

That is, each of the NVM AI cores 110 performs a 4-bit MAC operation and stores the resultant 4-bit data in the SRAM in the example illustrated in FIG. 6. Here, the AI core 120 performs an 8-bit MAC operation by combining the 4-bit MAC operation results and stores the resultant 8-bit data in the SRAM.

In the example illustrated in FIG. 6, the AI core 120 generates an 8-bit MAC operation result ($F_{IN}[7:0] \times W[7:0]$) using four 4-bit MAC operation results ($F_{IN}[7:4] \times W[7:4]$, $F_{IN}[3:0] \times W[7:4]$, $F_{IN}[7:4] \times W[3:0]$, and $F_{IN}[3:0] \times W[3:0]$) and stores the same in the SRAM. Here, the pieces of 4-bit feature data ($F_{IN}[7:4]$ and $F_{IN}[3:0]$) may be read from the SRAM, and the pieces of 4-bit weight data (W[7:4] and W[3:0]) may be read from the NVM, such as MRAM or the like.

Here, '<<' and '+' illustrated in FIG. 6 may denote a shift operation and an accumulation operation, respectively.

In the examples illustrated in FIG. 5 and FIG. 6, an NVM AI core that is not used for the operation may be disabled by being power-gated, like the AI core that is not used for the operation. Here, FIG. 5 illustrates an embodiment for a 4-bit operation, and FIG. 6 illustrates an embodiment for an 8-bit operation.

An AI algorithm performed using an AI processor may correspond to multiple layers, and data bit widths required for the respective layers may be set to be different. Accordingly, an NVM AI core and an AI core required for operation may be set for each of the layers, and an unnecessary NVM AI core or AI core may be disabled by being power-gated.

Figure 7:
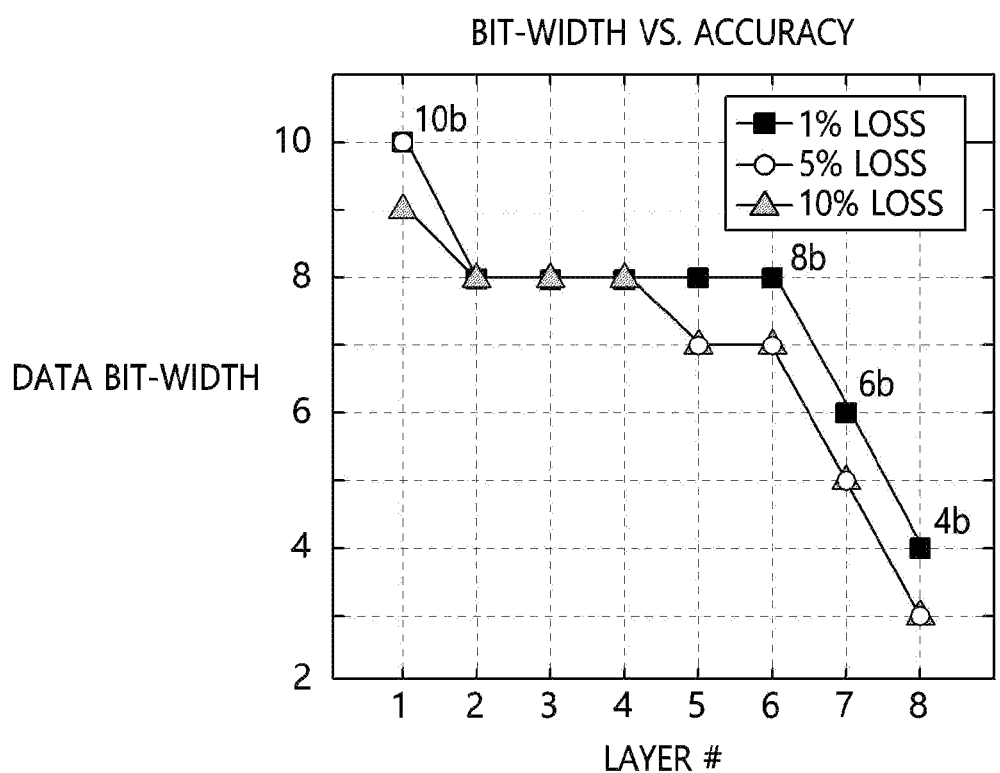
FIG. 7 is a graph illustrating variation in a data bit width depending on changes in the number of layers corresponding to a deep-learning operation.

FIG. 7 is a graph illustrating variation in a data bit width depending on a change in the number of layers corresponding to a deep-learning operation.

Here, each of "1% Loss", "5% Loss" and "10% Loss" illustrated in FIG. 7 indicates accuracy.

Referring to FIG. 7, in the case of layer #8, the required data bit width is equal to or less than 4 bits, in which case the AI core may be disabled by being power-gated, as illustrated in FIG. 5.

The AI processor based on heterogenous AI cores according to an embodiment of the present invention operates the minimum necessary number of cores by controlling NVM AI cores and an AI core depending on the data width (bit width or bit precision), thereby minimizing power consumption.

Also, the AI processor according to an embodiment of the present invention configures weights and features to have data widths that enable the amount of power consumed for each layer to be minimized, thereby operating only the minimum number of NVM AI cores and an AI core required for each layer.

Also, the AI processor according to an embodiment of the present invention stores only weights corresponding to non-zero values in NVM, such as MRAM or the like, and reads only features to be multiplied by nonzero weights, thereby operating efficiently.

Consequently, the AI processor according to an embodiment of the present invention may support 4-bit to 8-bit data precision while operating at very low power, thus being applicable to AIoT.

Figure 8:
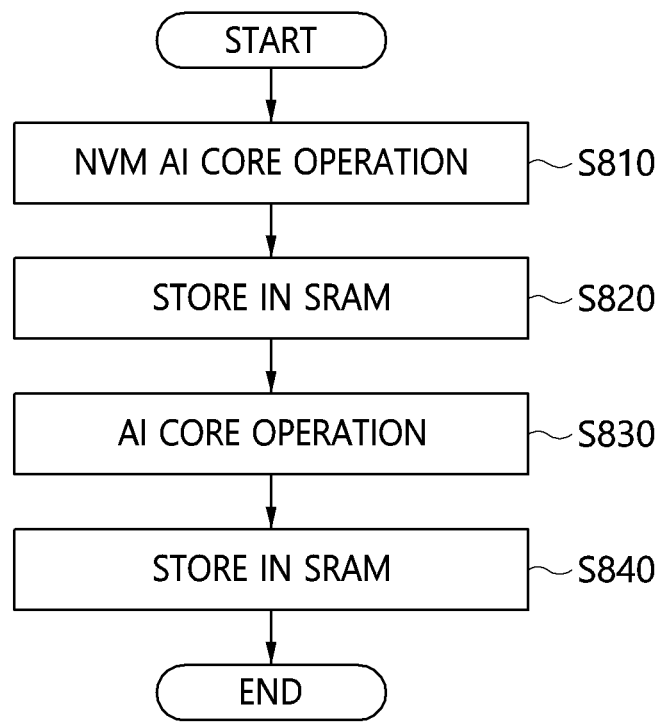
FIG. 8 is a flowchart illustrating a method for processing a deep-learning operation according to an embodiment of the present invention.

FIG. 8 is a flowchart illustrating a method for processing a deep-learning operation according to an embodiment of the present invention.

Referring to FIG. 8, in the method for processing a deep-learning operation according to an embodiment of the present invention, respective multiple NVM AI cores perform basic unit operations required for a deep-learning operation based on data stored in NVM at step S810.

Here, the NVM may be MRAM.

Here, the basic unit operation may be a 4-bit Multiply and Accumulation (MAC) operation.

Also, in the method for processing a deep-learning operation according to an embodiment of the present invention, at least some of the results of the basic unit operations are stored in SRAM at step S820.

Also, in the method for processing a deep-learning operation according to an embodiment of the present invention, an AI core performs an accumulation operation on the results of the basic unit operations at step S830.

Here, the AI core may generate an expanded bit operation result by accumulating the results of the basic unit operations.

Here, the expanded bit operation result may be 8 bits.

Also, in the method for processing a deep-learning operation according to an embodiment of the present invention, the result of the accumulation operation is stored in the SRAM at step S840.

Here, some of the NVM AI cores and the AI cores may be power-gated depending on the bit width required for the deep-learning operation.

Here, the bit width required for the deep-learning operation may be set for each layer corresponding to the deep-learning operation.

Here, the SRAM may store features required for the basic unit operation.

Here, the NVM may store nonzero weights.

According to the present invention, there may be provided a low-power AI processor using a deep-learning accelerator core (AI core) based on Processing-In-Memory (PIM) using Non-Volatile Memory (NVM) such as Magnetic Random-Access Memory (MRAM).

Also, the present invention may enable an AI processor to operate at low power by appropriately combining multiple NVM AI cores and an AI core.

Also, the present invention may minimize the amount of power consumed by an AI processor by operating only components (AI cores) essential for a deep-learning operation.

Also, the present invention may minimize the amount of power consumed by an AI processor by storing or reading only features multiplied by nonzero weights.

As described above, the AI processor and the method for processing a deep-learning operation according to the present invention are not limitedly applied to the configurations and operations of the above-described embodiments, but all or some of the embodiments may be selectively combined and configured, so that the embodiments may be modified in various ways.

What is claimed is:

1. An Artificial Intelligence (AI) processor, comprising:
   multiple Non-Volatile Memory (NVM) AI cores for respectively performing fixed-bit Multiply and Accumulation (MAC) operations required for a deep-learning operation based on data stored in NVM;
   Static Random-Access Memory (SRAM) for storing at least part of results of the fixed-bit MAC operations; and
   an AI core for performing an accumulation operation on the results of the fixed-bit MAC operations,
   wherein the AI core generates an expanded bit operation result by accumulating the results of the fixed-bit MAC operations which are stored in the SRAM.

2. The AI processor of claim 1, wherein:
the fixed-bit MAC operation is a 4-bit Multiply and Accumulation (MAC) operation, and
the expanded bit operation result corresponds to 8 bits.

3. The AI processor of claim 1, wherein:
part of the NVM AI cores and the AI core are power-gated depending on a bit width required for the deep-learning operation.

4. The AI processor of claim 3, wherein:
the bit width required for the deep-learning operation is set for each layer corresponding to the deep-learning operation.

5. The AI processor of claim 1, further comprising:
an AI DRAM controller for providing weights required for the fixed-bit MAC operations to the NVM based on AI data stored in DRAM.

6. The AI processor of claim 5, wherein:
the AI DRAM controller reads features required for the fixed-bit MAC operations from the DRAM and stores the features in the SRAM.

7. The AI processor of claim 6, wherein:
the AI DRAM controller stores only nonzero weights in the NVM.

8. The AI processor of claim 7, wherein:
the AI DRAM controller reads only features to be multiplied by nonzero weights from the DRAM.

9. The AI processor of claim 8, wherein:
the AI DRAM controller includes
a Direct Memory Access (DMA) unit for performing control for reading data from the DRAM and writing data to the DRAM;
a sparse weight unit for providing nonzero weight information to the DMA unit; and
a DRAM protocol converter for writing data to the DRAM or reading data from the DRAM based on control of the DMA unit.

10. The AI processor of claim 1, wherein:
each of the NVM AI cores includes
an NVM array; and
a MAC operator for performing a MAC operation based on data read from the NVM array.

11. A method for processing a deep-learning operation, comprising:
performing, by respective multiple Non-Volatile Memory (NVM) AI cores, fixed-bit Multiply and Accumulation (MAC) operations required for a deep-learning operation based on data stored in NVM;
storing at least part of results of the fixed-bit MAC operations in SRAM;
performing, by an AI core, an accumulation operation on the results of the fixed-bit MAC operations; and
storing a result of the accumulation operation in the SRAM,
wherein the AI core generates an expanded bit operation result by accumulating the results of the fixed-bit MAC operations which are stored in SRAM.

12. The method of claim 11, wherein:
the fixed-bit MAC operation is a 4-bit Multiply and Accumulation (MAC) operation, and the expanded bit operation result corresponds to 8 bits.

13. The method of claim 11, wherein:
part of the NVM AI cores and the AI core are power-gated depending on a bit width required for the deep-learning operation.

14. The method of claim 13, wherein:
the bit width required for the deep-learning operation is set for each layer corresponding to the deep-learning operation.

15. The method of claim 11, wherein:
the SRAM stores features required for the fixed-bit MAC operations.

16. The method of claim 15, wherein:
the NVM stores only nonzero weights.

* * * * *